(12) United States Patent
Reuter et al.

(10) Patent No.: US 8,009,499 B2
(45) Date of Patent: Aug. 30, 2011

(54) PROVIDING A CAPACITOR-BASED POWER SUPPLY TO ENABLE BACKUP COPYING OF DATA FROM VOLATILE STORAGE TO PERSISTENT STORAGE

(75) Inventors: James Michael Reuter, Colorado Springs, CO (US); Lukas Lloyd Wardensky, Houston, TX (US)

(73) Assignee: Hewlett-Packard Development Company, L.P., Houston, TX (US)

(*) Notice: Subject to any disclaimer, the term of this patent is extended or adjusted under 35 U.S.C. 154(b) by 511 days.

(21) Appl. No.: 12/243,857

(22) Filed: Oct. 1, 2008

(65) Prior Publication Data

US 2010/0080057 A1 Apr. 1, 2010

Related U.S. Application Data

(60) Provisional application No. 61/061,684, filed on Jun. 16, 2008.

(51) Int. Cl.
*G11C 5/14* (2006.01)

(52) U.S. Cl. ...................................... 365/226; 365/228

(58) Field of Classification Search .................. 365/226, 365/228, 185.04, 185.08
See application file for complete search history.

(56) References Cited

U.S. PATENT DOCUMENTS

| | | | |
|---|---|---|---|
| 6,115,313 A * | 9/2000 | Pio ................................ | 365/228 |
| 7,003,620 B2 | 2/2006 | Avraham et al. | |
| 7,536,506 B2 * | 5/2009 | Ashmore et al. .............. | 711/114 |
| 7,830,732 B2 * | 11/2010 | Moshayedi et al. ......... | 365/189.2 |
| 2009/0235038 A1 * | 9/2009 | Sartore ......................... | 711/162 |

* cited by examiner

Primary Examiner — Anh Phung

(57) ABSTRACT

A system includes a volatile storage, a persistent storage, a capacitor-based power supply, and a controller coupled to the capacitor-based power supply. The controller detects interruption of main power, and in response to detecting the interruption of main power, begins backup copying of data from the volatile storage to the persistent storage. After beginning the backup copying of data, the controller checks whether the main power has resumed prior to depletion of the capacitor-based power supply. In response to detecting that main power has resumed prior to depletion of the capacitor-based power supply, the controller resumes operation using content of the volatile storage without restoring data from the persistent storage.

15 Claims, 3 Drawing Sheets

PROVIDING A CAPACITOR-BASED POWER SUPPLY TO ENABLE BACKUP COPYING OF DATA FROM VOLATILE STORAGE TO PERSISTENT STORAGE

CROSS REFERENCE TO RELATED APPLICATIONS

This application claims the benefit of provisional patent application Ser. No. 61/061,684, filed Jun. 16, 2008, titled "Providing a Capacitor-based Power Supply to Enable Backup Copying of Data from Volatile Storage to Persistent Storage" which application is incorporated by reference herein as if reproduced in full below.

BACKGROUND

Volatile memory devices are used in many types of systems to provide relatively high-speed access of data. Typically, volatile memory devices include dynamic random access memories (DRAMs) and static random access memories (SRAMs). Volatile memory devices are commonly used in cache memories to temporarily store data that exists in secondary storage (e.g., hard disk drives).

With volatile memory devices, system power loss may cause loss of data stored in the volatile memory devices (that have not yet been written back to persistent secondary storage). To store certain critical data, some systems use battery-backed volatile memory devices. A battery-backed volatile memory device is a memory device that is coupled to a battery power source. In case of system power loss, power from the battery power source can be used to maintain data stored in the volatile memory device for some period of time (until the battery power source becomes depleted).

An issue associated with using batteries to provide backup power to volatile memory devices is that batteries are associated with a relatively short life. Batteries tolerate a fixed number of charge-discharge cycles before the batteries wear out, which may result in the batteries having to be replaced. Replacing batteries is associated with replacement costs that include part costs, service costs, and warranty costs. Also, relatively complex monitoring circuitry is often used to monitor a battery to ensure the battery has sufficient power to maintain data in a volatile memory device for a desired amount of time. Moreover, system design complexity is increased since the system has to be designed such that the battery can be accessed for replacement. In addition, worn out batteries have to be disposed, which is associated with disposal costs and which poses environmental concerns.

BRIEF DESCRIPTION OF THE DRAWINGS

Some embodiments of the invention are described with respect to the following figures.

DETAILED DESCRIPTION

Figure 1:
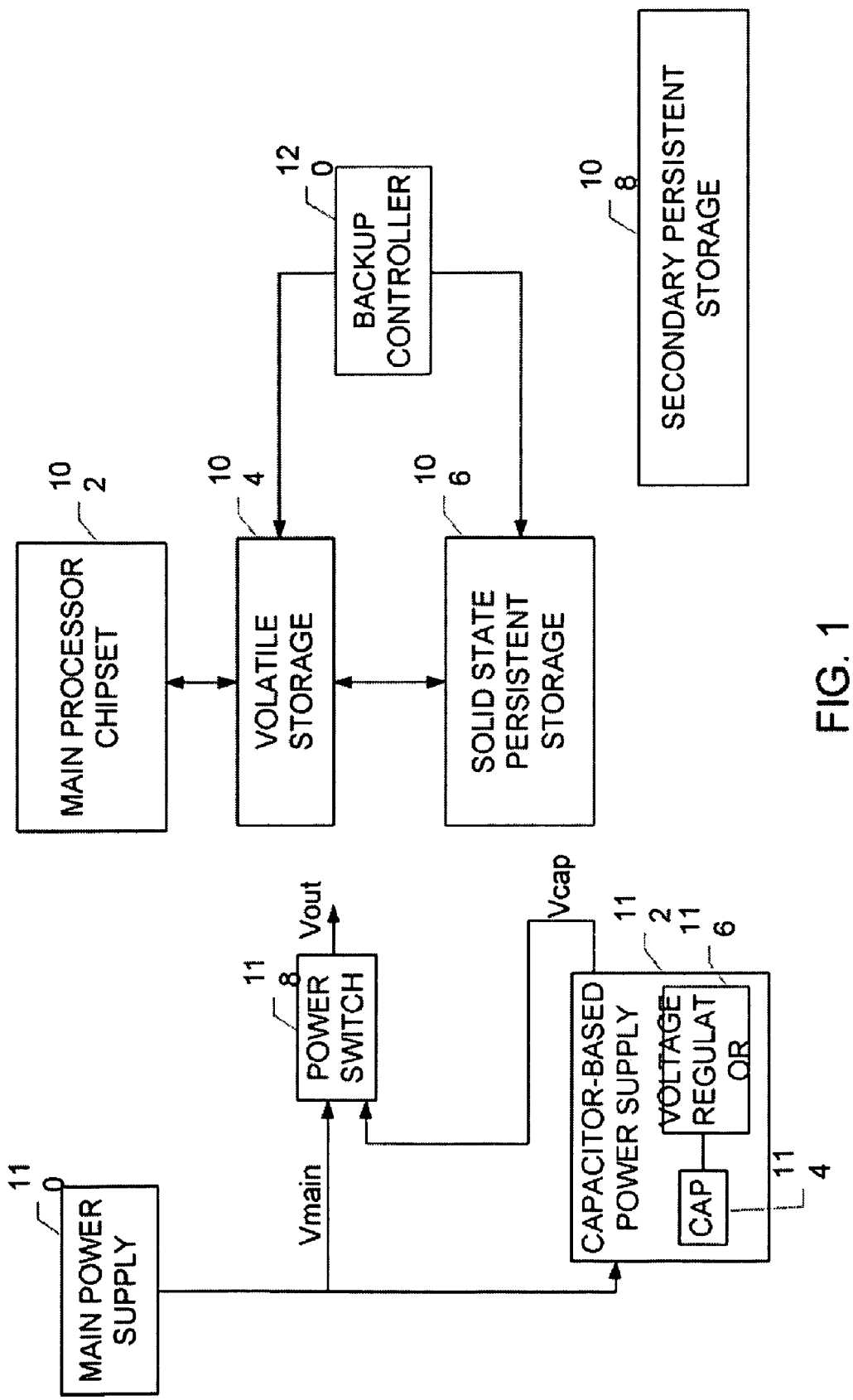
FIG. 1 is a block diagram of an exemplary system that includes a capacitor-based power supply, a volatile storage, a persistent storage, and a controller to use power provided by the capacitor-based power supply to perform backup copying of data from the volatile storage to the persistent storage in response to interruption of main power, in accordance with an embodiment.

In accordance with some embodiments, a capacitor-based power supply is provided to provide temporary power to enable backup copying of data from a volatile storage to a persistent storage in case of interruption of main power in a system. In some embodiments, the capacitor-based power supply includes a super-capacitor (also known as an ultra-capacitor), which refers to a class of capacitors that offer capacitances of one Farad or greater. A super-capacitor offers an amount of capacitance that is large enough to provide energy storage for standby power for certain applications. Super-capacitors can come in various form factors, with some super-capacitors being small enough to mount on a printed circuit board. In contrast to batteries, a super-capacitor is a passive component that has essentially the same life as other passive components in an electronics product (e.g., resistors, transistors, etc.). Therefore, the super-capacitor would likely have the same life as remaining components of a typical system, which should eliminate having to perform removal and replacement of super-capacitors during the life of the system. Super-capacitors also tolerate a relatively large number of charge-discharge cycles, much greater than batteries. Moreover, super-capacitors can be charged rapidly, typically much faster than charging of batteries. Moreover, detecting the remaining energy capacity of the super-capacitor is relatively easy—the voltage of the super-capacitor directly corresponds to the remaining available energy.

To efficiently handle interruption of system main power, a backup controller is provided to use power provided by the capacitor-based power supply for backup copying of data from the volatile storage to the persistent storage. In response to detecting interruption of the main power, the controller begins the backup copying of data from the volatile storage to the persistent storage (both of which are also powered by the capacitor-based power supply). After performing the backup copying, the controller next detects whether main power has resumed prior to depletion of the capacitor-based power supply. "Depletion" of the capacitor-based power supply refers to the condition of the capacitor-based power supply in which a voltage of capacitor(s) used in the capacitor-based power supply has dropped below a predefined voltage such that data in the volatile storage can no longer be maintained (and thus will become lost). If the controller detects that the main power has resumed prior to depletion of the capacitor-based power supply, then normal operation of the system can resume using content of the volatile storage, without having to perform recovery of data from the persistent storage to the volatile storage. Not having to perform a recovery procedure in the case where main power has resumed prior to depletion of the capacitor-based power supply allows for quicker resumption of normal operation of the system, and avoids a potentially lengthy recovery procedure in which data is being copied from persistent storage to volatile storage.

Examples of volatile storage include dynamic random access memories (DRAMs) and static random access memories (SRAMs). FIG. 1 illustrates an exemplary arrangement that is part of a system. The system can be a computer system, a storage array controller (for controlling an array of storage devices), or other types of systems. A main processor chipset 102 forms the processing core of the system, and may include a central processing unit (CPU), or multiple CPUs. Also, the main processor chipset 102 can include a memory controller for controlling volatile storage 104 (which can be implemented with DRAMs or SRAMs).

FIG. 1 also depicts a solid state persistent storage 106, which includes one or more flash memory devices or EEPROM devices. A "solid state" persistent storage refers to storage that is implemented with integrated circuit technology. The solid state persistent storage 106 is distinguished from secondary persistent storage 108, which is implemented with disk-based storage devices, such as hard disk based storage devices or optical disk storage devices.

The system of FIG. 1 also includes a main power supply 110 that provides the main power to the system during normal operation. The output of the main power supply 110 is a supply voltage Vmain. Note that typically a main power supply 110 produces multiple output supply voltages to supply power to different components in the system. Vmain thus represents just one or multiple ones of the output voltages from main power supply 110.

The system of FIG. 1 also includes a capacitor-based power supply 112, which is a backup power supply used in case of interruption of Vmain the main power supply 110. The capacitor-based power supply 112 includes a capacitor 114 (or multiple capacitors), such as a super-capacitor (or multiple super-capacitors), that temporarily provides power to enable backup copying of data from the volatile storage 104 to the solid state persistent storage 106 when interruption of the main power from the main power supply 110 occurs.

The supply voltage Vmain is used to charge the capacitor-based power supply 112 when power from the main power supply 110 is available.

The output voltage of the capacitor-based power supply 112 is depicted as Vcap (which can represent just one voltage or multiple voltages). The output voltage Vcap can come directly from the capacitor 114 in the capacitor-based power supply 112, or alternatively, Vcap can come from a voltage regulator 116. The voltage regulator 116 is able to tolerate an input (from the super-capacitor 114) that can be higher or lower than the target output voltage, to produce a relatively constant output voltage. In some implementations, the voltage regulator 116 can be omitted. In such implementations, though, the volatile storage 104 and solid state persistent storage 106 would have to be implemented with devices that are capable of handling a voltage that gradually changes as the capacitor 114 is discharged.

The main supply voltage Vmain and the capacitor voltage Vcap are provided to inputs of a power switch 118, which outputs a supply voltage Vout (which also could represent just one voltage or multiple voltages). The power switch 118 selects which of Vmain and Vcap is output as Vout, which is connected to the main processor chipset 102, volatile storage 104, solid state persistent storage 106, and backup controller 120. When the main power supply 110 is interrupted, the power switch 118 can switch from Vmain to Vcap to output on Vout.

The backup controller 120 is able to detect interruption of the main power provided by the main power supply 110, and in response to detecting such interruption, to perform backup copying of data from the volatile storage 104 to the solid state persistent storage 106. When the main power supply 110 is interrupted, the backup controller 120 is powered by the capacitor-based power supply 112, as are the volatile storage 104 and the solid state persistent storage 106. When the main power supply 110 is interrupted, the main processor chipset 102 can be powered down to reduce load on the capacitor-based power supply 112.

Although the backup controller 120 is shown as controlling the volatile storage 104 and the solid state persistent storage 106, it is noted that the backup controller 120 can be implemented with multiple integrated circuit (IC) chips. For example, the volatile storage 104 can be controlled by a memory controller in the main processor chipset 102, while the solid state persistent storage 106 is controlled by a flash controller or other persistent storage controller, for the purpose of performing backup copying of data in the volatile storage to the solid state persistent storage. Alternatively, the control for both the volatile storage 104 and solid state persistent storage 106 can be implemented in a single IC chip.

Alternatively, if the main processor chipset 102 is a low-power chipset, then the main processor chipset 102 can also be used as the backup controller, such that a separate backup controller 120 does not have to be provided.

In the ensuing discussion, it is assumed that the volatile storage 104 is implemented with one or more DRAMs. In such an implementation, the backup copying of data from the DRAM(s) to the solid state persistent storage is referred to as a "DRAM dump." Although the ensuing discussion refers to DRAM dumps, it is noted that the same techniques could be applied to backup copying from other types of volatile storage devices.

In some embodiments, the solid state persistent storage 106 is implemented with NAND flash memory device(s). A characteristic of a NAND flash memory device is that an erase cycle of a block in the NAND flash memory device has to be performed before data can be written to that block. Therefore, to keep the erase cycles out of the DRAM dump process (backup copying of data from the DRAM to the flash memory), the backup controller 120 is configured to maintain sufficient space in the flash memory device(s) 106 to contain at least one full dump from the volatile storage 104. In some implementations, the available storage in the flash memory device(s) is at least two times the content of the DRAM that has to be protected. By avoiding performing erase cycles during the DRAM dump process, draining of the capacitor-based power supply 112 prior to completion of the dump process can be avoided or reduced.

Another aspect of flash memory devices (or EEPROM devices) is that they are subject to wear due to repeated erase and write cycles. In accordance with some embodiments, the backup controller 120 uses a wear-leveling algorithm such as a circular algorithm, to ensure the leveling of wear across the entire persistent storage device is uniform (such that one part of the persistent storage device is not repeatedly erased and written such that that the one part would be worn faster than other parts of the persistent storage device).

Figure 2:
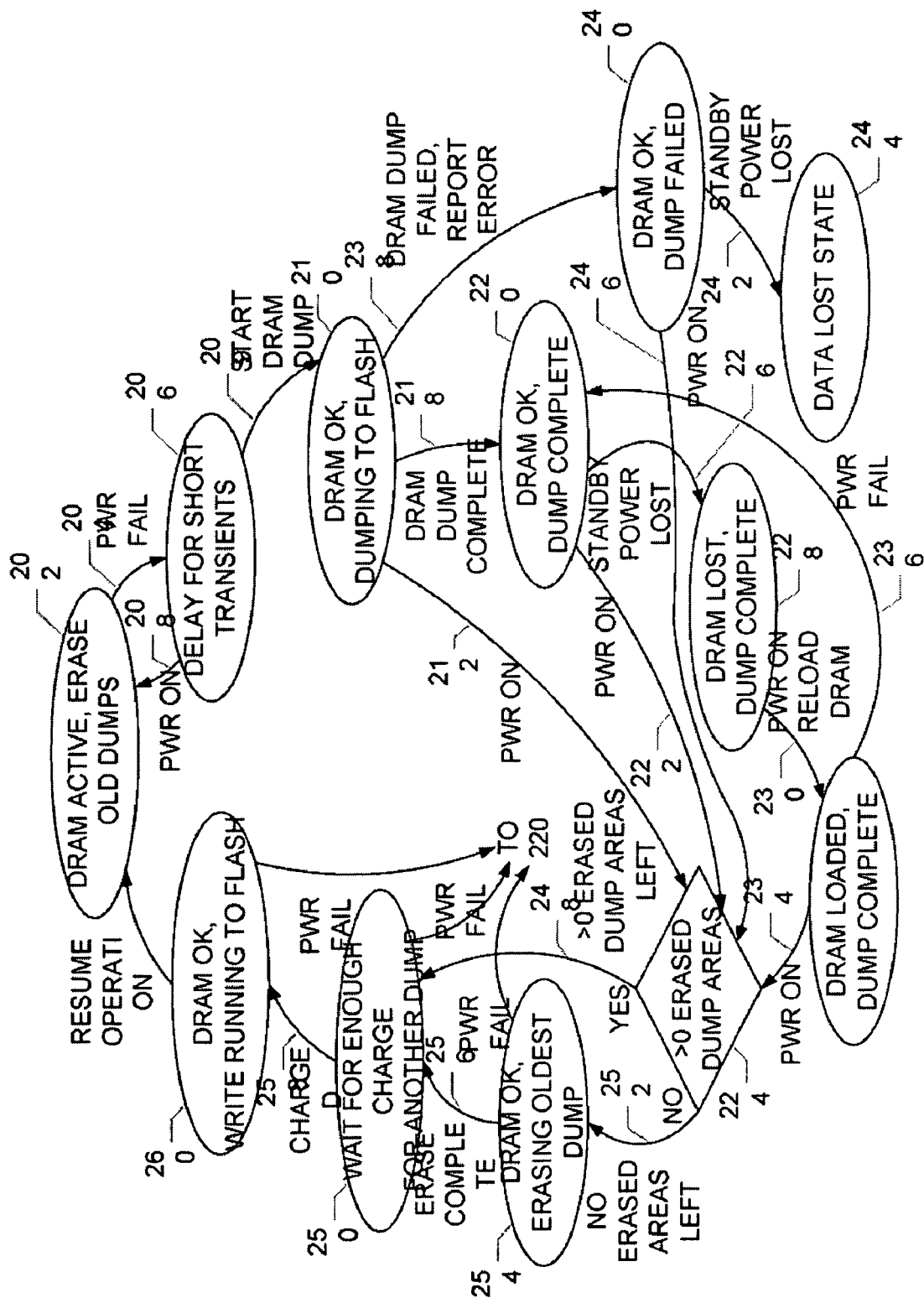
FIG. 2 is a state diagram that illustrates tasks performed by the controller of FIG. 1, in accordance with an embodiment.

FIG. 2 is a state diagram that illustrates an exemplary procedure performed by the backup controller 120 to provide protection for content of the volatile storage 104 in the presence of main power interruption. The ensuing discussion assumes that the volatile storage 104 is implemented with a DRAM device, and the solid state persistent storage 106 is implemented with a flash memory device. The same technique can be applied to other implementations in which the volatile storage 104 and solid state persistent storage 106 are implemented with other types of storage devices.

The backup controller 120 starts (202) in the DRAM active state. In the DRAM active state, system operation proceeds normally by writing data to and retrieving data from the DRAM device. In the DRAM active state (202), the backup controller 120 erases any old dumps (previous backup copies of volatile storage content) in the flash memory device.

Upon detection of a power failure (204), the backup controller 120 waits (at 206) a predefined delay time duration, in case of a transient condition. The delay can be seconds or tens of seconds. The delay at 206 is to ensure that the dump process does not occur due to a power transient condition, in which the main power supply suffers a relatively short interruption that would not cause data loss. If main power returns before the predetermined delay duration has expired (208), the backup controller 120 returns to state 202.

However, if the predetermined delay duration expires and the main power has not returned, the backup controller 120 starts the DRAM dump (208) and proceeds to state 210, where the backup controller 120 continues the backup copying of data (dumping of data) from the DRAM device to the flash memory device.

As the dumping of data from the DRAM device to the flash memory device proceeds, the backup controller 120 can detect resumption of the main power from the main power supply 110 (212) in which case the backup controller proceeds to state 224 (discussed further below) to allow the backup controller to return to the DRAM active state after certain conditions are met. Effectively, this means that if the main power returns after main power interruption and after the DRAM dump has started (but not yet completed), the system can proceed to use the content of the DRAM device without having to complete the DRAM dump operation and to restore data from the flash memory device to the DRAM device before normal system operation can resume.

From state 210, upon completion of the DRAM dump (218), the backup controller proceeds to state 220, in which a dump complete record is written to the flash memory device. The dump complete record is used to signify that the content of the flash memory device can be used to perform resumption of system operation upon the next power-on procedure.

In state 220, after the dump complete record has been written to the flash memory device, power to the backup controller 120 and flash memory device can be shut off, so that power is provided only to the DRAM device. This is to allow the capacitor-based power supply 112 to maintain power to the DRAM device for as long as possible such that if main power is to resume before power from the capacitor-based power supply is depleted, system operation can resume from the DRAM device without having to perform a recovery procedure to recover data from the flash memory device to the DRAM device.

Thus, at state 220, if the main power resumes (222) prior to the capacitor-based power supply being depleted, the backup controller 120 proceeds to state 224. The procedure starting in the state 224 is explained further below.

However, from state 220, if the capacitor-based power supply 112 is depleted (226), and the main power has not resumed, then the backup controller 120 proceeds to, state 228, which is a dump complete state. At this point, system power is lost, and no power is provided to any of the components depicted in FIG. 1.

From state 228, upon the next main power resumption (230), a recovery procedure is performed to reload data from the flash memory device to the DRAM device. Upon complete recovery, the DRAM device is fully loaded, and the backup controller 120 proceeds to state 232. From state 232, assuming that the main power remains on (234), the backup controller proceeds to state 224. However, if main power should be lost again (236), the backup controller 120 proceeds from state 232 back to state 220.

After main power interruption that has caused the backup controller to transition to state 210, it is possible that the dump of data from the DRAM device to the flash memory device resulted in an error or failure (238). In this case, the backup controller 120 proceeds from state 210 to dump failed state 240, where the backup controller 120 waits to detect whether main power has resumed prior to depletion of the capacitor-based power supply 112, or the capacitor-based power supply becomes depleted prior to main power resuming. In the latter case (242), the backup controller 120 proceeds to the data lost state (244), which is the state in which data in the DRAM device has been lost and cannot be recovered. At this point, any of various recovery procedures could be implemented to recover data.

However, from the dump failed state (240), if the main power resumes before the capacitor-based power supply 112 becomes depleted (246), the backup controller 120 proceeds from state 240 to state 224 to allow the backup controller 120 to proceed back to the DRAM active state (202) after certain conditions are met. In this latter case, even though the DRAM dump failed, system operation can still proceed if the main power comes back before the capacitor-based power supply becomes depleted.

As noted above, when power is resumed when the backup controller is in states 220 and 232, the backup controller 120 proceeds to state 224. To resume normal operation from state 224, the flash memory device has to be first checked to ensure that there is sufficient available space in the flash memory device to hold another dump from the DRAM device. If there is insufficient capacity, then erase operations of the flash memory device would have to be first performed to free up available space in the flash memory device before allowing normal system operation to resume.

In state 224, the backup controller 120 checks to see if there are greater than zero erased dump areas (which means that there is at least one dump area available for holding the content of the DRAM device). If there is greater than zero dump areas (248), the backup controller proceeds from state 224 to state 250 where the backup controller 120 waits for enough charge to be in the capacitor-based power supply 112 to perform another dump. Enough charge is based on measuring the voltage of the capacitor 114 in the capacitor-based power supply. As long as the voltage of the capacitor 114 is greater than some predefined threshold, that is an indication that sufficient charge exists for another dump.

In state 224, if there are no erased dump areas present (252), then the backup controller 120 proceeds from state 224 to state 254, where the backup controller 120 erases the oldest dump area of the flash memory device. After the erase operation has completed (256), the backup controller 120 proceeds to state 250.

From state 250, after detecting that there is sufficient charge in the capacitor 114 of the capacitor-based power supply 112 (258), the backup controller 120 proceeds to state 260, where the backup controller 120 marks the flash memory device with a running record to indicate that the content of the DRAM device can be changed. Normal operation is then resumed by transitioning to state 202.

From states 254, 250, and 260, should main power fail again before the backup controller returns to the DRAM active state (202), the backup controller 120 will proceed to state 220 to again wait for main power resumption.

The procedure depicted in FIG. 2 can be implemented in hardware or in a combination of firmware and hardware. The firmware can be encoded in a storage area of the integrated circuit of the backup controller 120.

The instructions of the firmware are loaded from the storage area, which is implemented with one or more computer-readable or computer-usable storage media. The loaded instructions of the firmware are executable by the backup controller 120.

Figure 3:
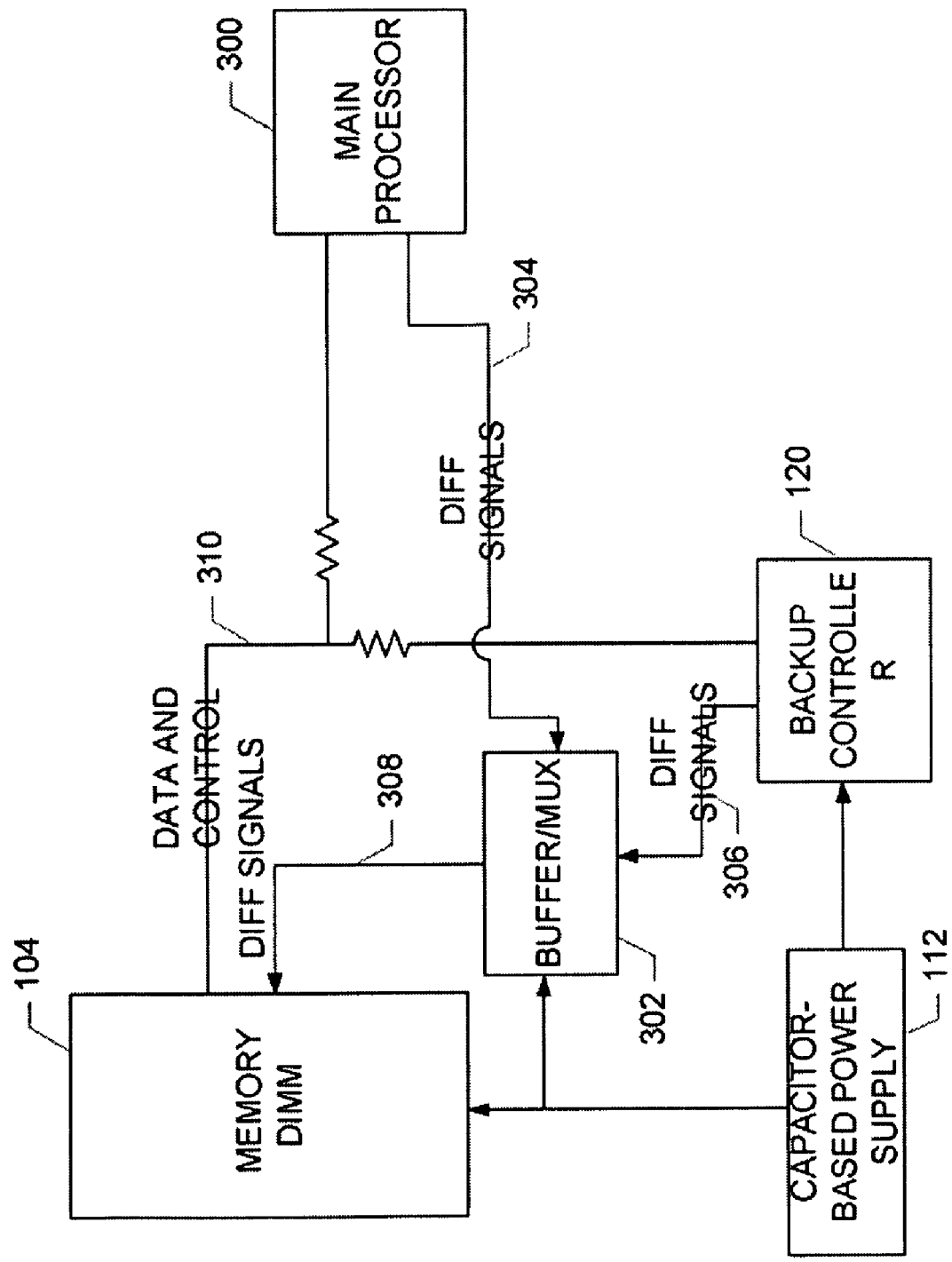
FIG. 3 is a block diagram of another exemplary system that uses a capacitor-based power supply, in accordance with another embodiment.

FIG. 3 shows an alternative arrangement in which the backup controller 120 shares the memory bus with a main memory controller 300 (which can be part of the main processor chipset 102 of FIG. 1, for example). Sharing of the memory bus by multiple memory controllers can cause signal integrity issues, especially on high-speed memory buses such as DDR2 (double data rate synchronous dynamic random access memory 2) memory buses.

Since differential signals are most susceptible to signal integrity issues, such differential signals are buffered and multiplexed using a buffer/multiplexer 302. Differential signals 304 from the main memory controller 300 are provided to one input of the buffer/multiplexer 302, while differential signals 306 from the backup controller 106 are provided to another input of the buffer/multiplexer 302. The buffer/multiplexer 302 selects one of the inputs for output as differential signals 308 to the memory 104 (which in FIG. 3 is implemented as a dual inline memory module or DIMM). The capacitor-based power supply 112 provides backup power to the memory 104, the buffer/multiplexer 302, and backup controller 120, to allow the backup controller 120 to dump data from the memory 104 to a solid state persistent storage.

The remaining signals of the main and backup controllers 300 and 120 are data and other control signals that are coupled to the memory 104. The impedances of the data and control bus lines connected to the main and backup controllers 300 and 120 are impedance matched to eliminate bus stubs that can cause signal integrity issues.

The differential signals 304, 306 and the data and control signals 310 make up the shared memory bus. The buffer/multiplexer 302 is considered to be part of the shared memory bus.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. An apparatus comprising:
    a volatile storage;
    a persistent storage;
    a capacitor-based power supply; and
    a controller, coupled to the capacitor-based power supply, to:
        detect interruption of main power,
        in response to detecting the interruption of main power, begin backup copying of data from the volatile storage to the persistent storage,
        after beginning the backup copying of data, check whether the main power has resumed prior to depletion of the capacitor-based power supply and
        in response to detecting that main power has resumed prior to depletion of the capacitor-based power supply, resume operation using content of the volatile storage without restoring data from the persistent storage.

2. The apparatus of claim 1, wherein the persistent storage comprises a solid state persistent storage.

3. The apparatus of claim 2, wherein the solid state persistent storage comprises one of a flash memory and electronically erasable and programmable read-only memory (EEPROM).

4. The apparatus or claim 1, wherein the capacitor-based power supply comprises a super-capacitor.

5. The apparatus of claim 4, wherein the capacitor-based power supply further comprises a voltage regulator to provide a regulated output voltage based on a voltage of the super-capacitor, the regulated output voltage provided to the volatile storage, persistent storage, and controller.

6. The apparatus of claim 1, wherein the controller is to further:
    in response to detecting that the capacitor-based power supply has depleted before main power has resumed, restore data from the persistent storage to the volatile storage before resuming system operation.

7. The apparatus of claim 6, wherein the controller is to further:
    after main power has resumed, check whether there is sufficient space in the persistent storage for copying data from the volatile storage to the persistent storage, and
    in response to detecting there is insufficient space, erase at least a portion of the persistent storage prior to resuming system operation.

8. The apparatus of claim 6, wherein the controller is to further:
    after main power has resumed, check whether there is sufficient charge in the capacitor-based power supply; and
    in response to detecting there is insufficient charge in the capacitor-based power supply, wait for recharging of the capacitor-based power supply prior to resuming system operation.

9. The apparatus of claim 1, further comprising a main power supply, wherein interruption of the main power comprises interruption of at least one output voltage from the main power supply.

10. The apparatus of claim 6, wherein the controller is to further:
    detect failure in copying data from the volatile storage to the persistent storage;
    in response to the detected failure,
        resume system operation if the main power has resumed before depletion of the capacitor-based power supply, and
        indicate a data loss state if the capacitor-based power supply is depleted prior to main power resumption.

11. The apparatus of claim 1, wherein the controller is a backup controller, the apparatus further comprising:
    a main memory controller that shares a bus with the backup controller,
    wherein the bus includes a buffer and multiplexer for differential signals from the main memory controller and backup controller.

12. A system comprising:
    a main power supply;
    a capacitor-based power supply;
    volatile storage;
    solid state persistent storage;
    a controller powered by the capacitor-based power supply to:
        detect interruption of the main power supply;
        in response to detecting the interruption of the main power supply, perform backup copying of data from the volatile storage to the solid state persistent storage;
        after beginning the backup copying of the data, check whether the main power supply has resumed provision of power prior to depletion of the capacitor-based power supply; and
        in response to detecting that the main power supply has resumed prior to depletion of the capacitor-based power supply, resume operation of the system using content of the volatile storage without restoring data from the solid state persistent storage.

13. The system of claim 12, wherein the capacitor-based power supply comprises at least one super-capacitor.

14. The system of claim 12, wherein the solid state persistent storage comprises one or more NAND flash memory devices.

15. A method of protecting data contained in volatile storage of a system, comprising:
- detecting interruption of system main power;
- in response to detecting interruption of the system main power, performing backup copying of data in the volatile storage to the solid state persistent storage using power provided by a capacitor-based power supply;
- in response to detecting resumption of the system main power prior to depletion of the capacitor-based power supply, resume system operation using content of the volatile storage without using content in the solid state persistent storage.

* * * * *

UNITED STATES PATENT AND TRADEMARK OFFICE
CERTIFICATE OF CORRECTION

| | | |
|---|---|---|
| PATENT NO. | : 8,009,499 B2 | Page 1 of 1 |
| APPLICATION NO. | : 12/243857 | |
| DATED | : August 30, 2011 | |
| INVENTOR(S) | : Reuter et al. | |

It is certified that error appears in the above-identified patent and that said Letters Patent is hereby corrected as shown below:

In column 7, line 45, in Claim 1, delete "power," and insert -- power; --, therefor.

In column 7, line 48, in Claim 1, delete "storage," and insert -- storage; --, therefor.

In column 7, line 51, in Claim 1, delete "supply" and insert -- supply; --, therefor.

In column 7, line 63, in Claim 4, delete "or" and insert -- of --, therefor.

In column 8, line 13, in Claim 7, delete "storage," and insert -- storage; --, therefor.

In column 8, line 31, in Claim 10, delete "further;" and insert -- further: --, therefor.

Signed and Sealed this
Sixth Day of March, 2012

David J. Kappos
*Director of the United States Patent and Trademark Office*